United States Patent
Petrarca et al.

(10) Patent No.: US 6,756,624 B2
(45) Date of Patent: Jun. 29, 2004

(54) ENCAPSULATED METAL STRUCTURES FOR SEMICONDUCTOR DEVICES AND MIM CAPACITORS INCLUDING THE SAME

(75) Inventors: Kevin S. Petrarca, Newburgh, NY (US); Donald Canaperi, Bridgewater, CT (US); Mahadevaiyer Krishnan, Hopewell Junction, NY (US); Kenneth Jay Stein, Sandy Hook, CT (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/409,010

(22) Filed: Apr. 7, 2003

(65) Prior Publication Data

US 2003/0211698 A1 Nov. 13, 2003

Related U.S. Application Data

(62) Division of application No. 10/034,862, filed on Dec. 28, 2001, now Pat. No. 6,597,068, which is a division of application No. 09/567,466, filed on May 9, 2000, now Pat. No. 6,368,953.

(51) Int. Cl.$^7$ ..................... H01L 27/108; H01L 29/76; H01L 29/94; H01L 31/119
(52) U.S. Cl. .................... 257/296; 257/303; 257/310
(58) Field of Search .................. 257/295, 296, 257/300, 301, 303, 306, 310, 532; 438/239, 240, 243, 250, 253, 386, 393, 396

(56) References Cited

U.S. PATENT DOCUMENTS

| | | |
|---|---|---|
| 3,385,773 A | 5/1968 | Frantzen |
| 3,464,855 A | 9/1969 | Shaheen et al. |
| 5,198,389 A | 3/1993 | van der Putten et al. |
| 5,240,879 A | 8/1993 | De Bruin |
| 5,256,274 A | 10/1993 | Poris |
| 5,308,796 A | 5/1994 | Feldman et al. |
| 5,549,808 A | 8/1996 | Farooq et al. |
| 5,793,112 A | 8/1998 | Hasegawa et al. |
| 5,976,928 A | * 11/1999 | Kirlin et al. ............ 438/240 |
| 6,110,648 A | 8/2000 | Jang |
| 6,207,552 B1 | 3/2001 | Wang et al. |
| 6,221,710 B1 | * 4/2001 | Hsue et al. ............ 438/238 |
| 6,251,771 B1 | 6/2001 | Smith et al. |
| 6,251,786 B1 | 6/2001 | Zhou et al. |
| 6,271,082 B1 | * 8/2001 | Hou et al. ............ 438/250 |

OTHER PUBLICATIONS

Electroless Plating for Low–Cost High–Leverage Wiring, IBM Technical Disclosure Bulletin, vol. 32 No. 3A, Aug. 1989.

* cited by examiner

*Primary Examiner*—Cuong Nguyen
*Assistant Examiner*—Hoai Pham
(74) *Attorney, Agent, or Firm*—James J. Cioffi

(57) ABSTRACT

A method is described for fabricating an encapsulated metal structure in a feature formed in a substrate. The sidewalls and bottom of the feature are covered by a barrier layer and the feature is filled with metal, preferably by electroplating. A recess is formed in the metal, and an additional barrier layer is deposited, covering the top surface of the metal and contacting the first barrier layer. The additional barrier layer is planarized, preferably by chemical-mechanical polishing. The method may be used in fabricating a MIM capacitor, with the encapsulated metal structure serving as the lower plate of the capacitor. A second substrate layer is deposited on the top surface of the substrate, with an opening overlying the encapsulated metal structure. A dielectric layer is deposited in the opening, covering the encapsulated metal structure at the bottom thereof. An additional layer, serving as the upper plate of the capacitor, is deposited to cover the dielectric layer and to fill the opening. The dielectric layer and the additional layer are planarized, preferably by CMP.

5 Claims, 8 Drawing Sheets

ENCAPSULATED METAL STRUCTURES FOR SEMICONDUCTOR DEVICES AND MIM CAPACITORS INCLUDING THE SAME

RELATED APPLICATIONS

This application is related to application Ser. Nos. 09/567,467, 09/567,468 and 09/567,469, filed the same day as the present application. All of these related applications are assigned to the same assignee as the present application. The disclosures of all these related applications are incorporated herein by reference.

This is a divisional of application Ser. No. 10/034,862 filed Dec. 28, 2001, now U.S. Pat. No. 6,597,068 which is a divisional of application Ser. No. 09/567,466 filed May 09, 2000, now U.S. Pat. No. 6,368,953.

FIELD OF THE INVENTION

This invention relates to semiconductor processing, and more particularly to a process for encapsulating an electroplated metal structure in a semiconductor device. This invention also relates to a metal-insulator-metal (MIM) capacitor in the device which incorporates such a metal structure.

BACKGROUND OF THE INVENTION

In the fabrication of semiconductor devices, metal lines are often embedded in dielectric layers in a multilevel structure, particularly in the latter stage ("back end of the line" or "BEOL") of the fabrication process. In general, it is necessary to isolate the metal lines on one level from the other levels. This is typically done by providing a high-dielectric-constant barrier (for example, silicon nitride) between the levels.

A conventional BEOL process, providing an electroplated metal line in an interlevel dielectric and an interlevel barrier, is shown in FIGS. 1A–1E. An interlevel dielectric layer (such as $SiO_2$) 10 has a feature 11 formed therein. A liner/adhesion promoter 12 for the plated line is deposited on the surface, including the sidewalls and bottom of feature 11 (FIG. 1A). In the case of copper electroplating, layer 12 is typically a combination of tantalum nitride (in contact with the substrate 10) and tantalum; layer 12 serves as a copper diffusion barrier while promoting adhesion to the substrate. As shown in FIG. 1B, a seed layer 13 for the metal to be plated is deposited over the entire surface. Plating is then performed on the entire surface, until feature 11 is filled in with plated metal 14 (see FIG. 1C). To ensure that the entire feature is filled in, plating continues until an excess of plated metal appears in areas 15 outside feature 11. This excess metal, along with the liner material in areas 15, is then removed with a planarization process such as chemical-mechanical polishing (CMP), to yield a metal line as shown in FIG. 1D. The plated metal 14 is surrounded by the liner 12, except on the top surface 14a.

In order to encapsulate the metal line (to prevent electrical shorts and degradation of the metal line due to electromigration and diffusion of the metal), the top surface of the interlayer dielectric 10 is blanketed with a dielectric layer 16 (see FIG. 1E). This layer is typically silicon nitride. The high dielectric constant of layer 16 increases the overall dielectric constant of the level structure (which includes interlevel dielectric 10, metal 14 and layer 16). This has the effect of degrading the performance of the completed semiconductor device.

There is a need for an improved BEOL fabrication process in which the plated metal is encapsulated but the blanket dielectric layer is eliminated, so that the performance of the semiconductor device is enhanced.

SUMMARY OF THE INVENTION

The present invention addresses the above-described need by providing a method of fabricating an encapsulated metal structure in a feature of a substrate, where the top surface of the substrate is exposed. This is done by covering the sidewalls and bottom of the feature with a first barrier layer; filling the feature with metal; forming a recess in the metal; and then depositing an additional barrier layer covering the top surface of the metal and contacting the first barrier layer. The additional barrier layer is then planarized, so that the top surface of the substrate is exposed. The planarization is preferably performed by CMP, and the feature is preferably filled by depositing a seed layer of metal in the feature and electroplating the metal.

According to one aspect of the invention, the recess in the metal is formed (preferably by CMP) so that a top surface of the metal is lower than the top surface of the substrate. A second barrier layer is then deposited on the top surface of the metal, and the first barrier layer and the second barrier layer are planarized. After planarization, the top surface of the substrate is exposed, the metal is encapsulated by the first barrier layer and the second barrier layer, and the second barrier layer is planar with the top surface of the substrate.

According to another aspect of the invention, planarizing the first barrier layer and the second barrier layer causes the top surface of the substrate to be exposed, and also causes a portion of the top surface of the metal to be exposed, with a remaining portion of the second barrier layer on the top surface of the metal. A second recess is then formed in the metal at the exposed portion thereof, and a third barrier layer is deposited on the top surface of the metal and on the remaining portion of the second barrier layer, thereby filling the second recess in the metal. The third barrier layer is then planarized so that the top surface of the substrate is exposed and the metal is encapsulated by the first barrier layer, the second barrier layer and the third barrier layer.

The present invention also provides a method of fabricating a metal-insulator-metal (MIM) capacitor which includes the above-described encapsulated metal structure. A first substrate layer has a feature formed therein, and an encapsulated metal structure is formed in the feature; the sidewalls and bottom of the feature are covered by a first barrier layer and the feature is filled with metal, covered by an additional barrier layer in contact with the first barrier layer. A second substrate layer is then deposited on the top surface of the first substrate layer and overlying the encapsulated metal structure; an opening is formed in the second substrate layer to expose the encapsulated metal structure. A dielectric layer is deposited on the second substrate layer, covering the sidewalls of the opening and the exposed encapsulated metal structure at the bottom of the opening. An additional layer is deposited, to cover the dielectric layer on the sidewalls and on the bottom of the opening and to fill the opening. The dielectric layer and the additional layer are then planarized.

According to an additional aspect of the invention, an encapsulated metal structure formed in a feature of a substrate is described. This structure includes a first barrier layer covering the sidewalls and bottom of the feature; metal filling the feature and having a recess formed therein, so that a top surface of the metal is lower than the top surface of the substrate; and an additional barrier layer covering the top surface of the metal and contacting the first barrier layer, so as to encapsulate the metal. The additional barrier layer is planarized so that the top surface of the substrate is exposed.

According to another aspect of the invention, a metal-insulator-metal (MIM) capacitor structure is described. This structure includes an encapsulated metal structure in a feature formed in a first substrate layer; the sidewalls and bottom of the feature are covered by a first barrier layer and the feature is filled with metal covered by an additional barrier layer in contact with the first barrier layer, to form a lower plate of the capacitor structure. The structure also includes a second substrate layer on the top surface of the first substrate layer; the second substrate layer has an opening formed therein overlying the encapsulated metal structure. A dielectric layer covers the sidewalls of the opening and a portion of the encapsulated metal structure at the bottom of the opening. An additional layer covers the dielectric layer on the sidewalls and bottom of the opening and fills the opening, to form an upper plate of the capacitor structure. The dielectric layer and the additional layer are planarized so that the top surface of the second substrate layer is exposed.

DETAILED DESCRIPTION OF THE PREFERRED EMBODIMENTS

In the following descriptions of the preferred embodiments of the invention, steps in the encapsulation of an electroplated Cu line embedded in a $SiO_2$ interlevel dielectric will be detailed. It will be appreciated that this is intended as an example only, and that the invention may be practiced with a variety of substrates and metals, and with various metal deposition processes. In particular, the invention is not restricted to encapsulation of a metal line formed by electroplating.

First Embodiment: Single Barrier Redeposition

Figure 2A:
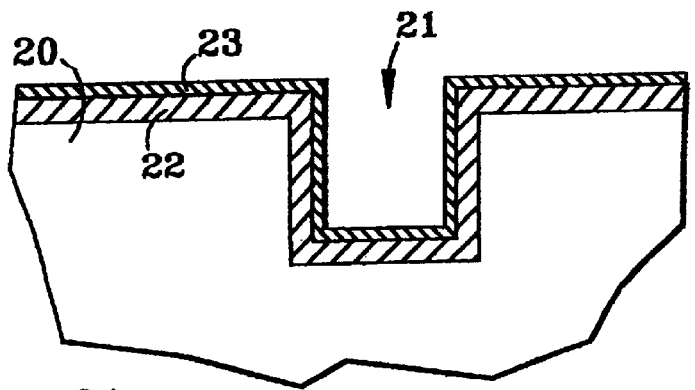
FIGS. 2A–2E illustrate steps in an encapsulation process according to a first embodiment of the present invention.

As shown in FIG. 2A, dielectric layer 20 has a feature 21 formed therein, where the metal line is desired. A layer 22 of liner material is deposited on the entire surface, including the sidewalls and bottom of feature 21. As noted above, in the case of plating Cu this liner material is preferably a combination of TaN and Ta, with the TaN in contact with the layer 20; the liner serves as a diffusion barrier and an adhesion promoter. A seed layer 23 is then deposited over the liner, typically by chemical vapor deposition (CVD).

Figure 1A:
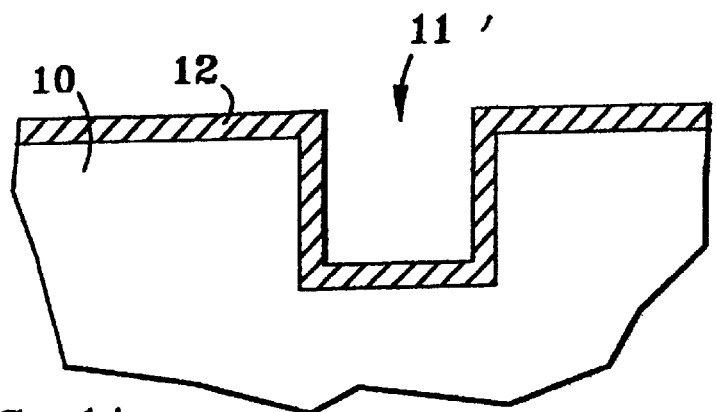
FIGS. 1A–1E illustrate steps in a conventional process for fabricating a metal line and encapsulating the metal line in an interlevel dielectric layer.
Figure 1B:
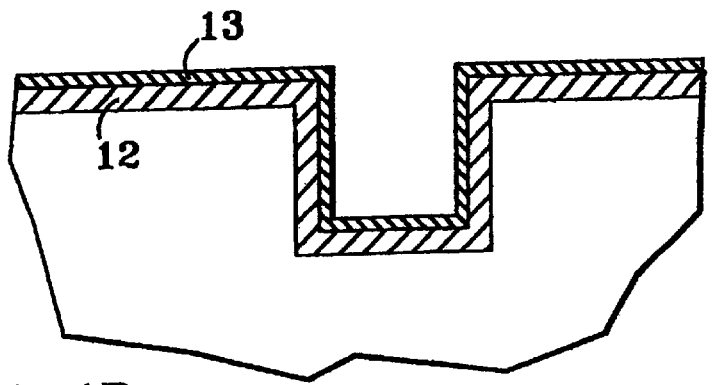
Figure 1C:
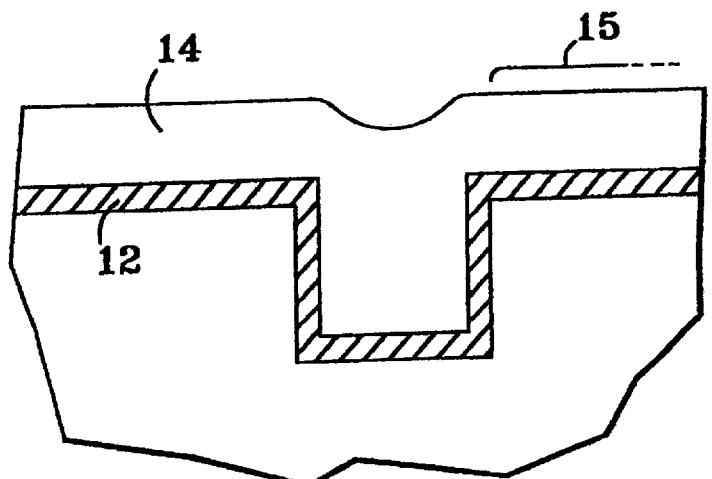
Figure 1D:
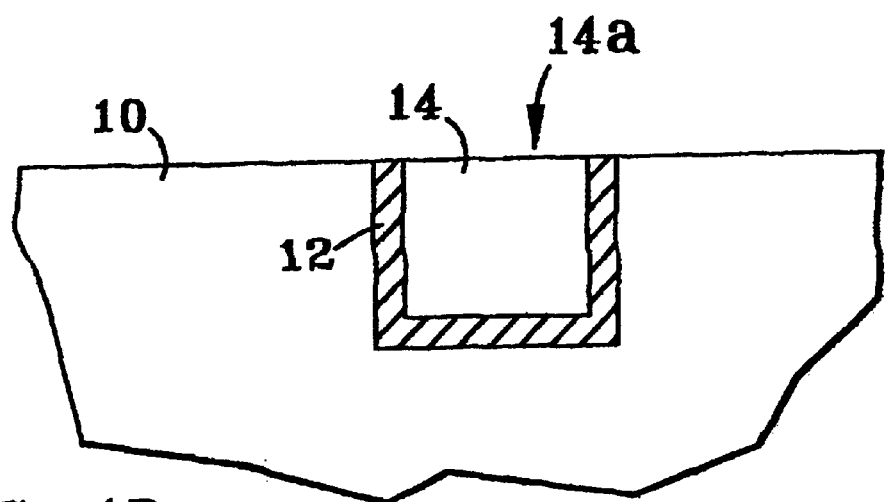
Figure 2B:
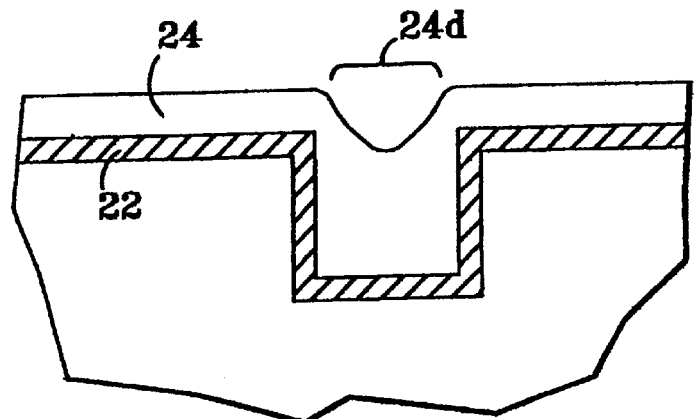

An electroplating process is then performed using the seed layer 23, to plate metal 24 on top of the liner 22. In contrast to the conventional process, the surface (including feature 21) is deliberately underplated; plated metal 24 fills in the feature 21, but with a depression 24d (see FIG. 2B, and compare with FIG. 1C).

Figure 2C:
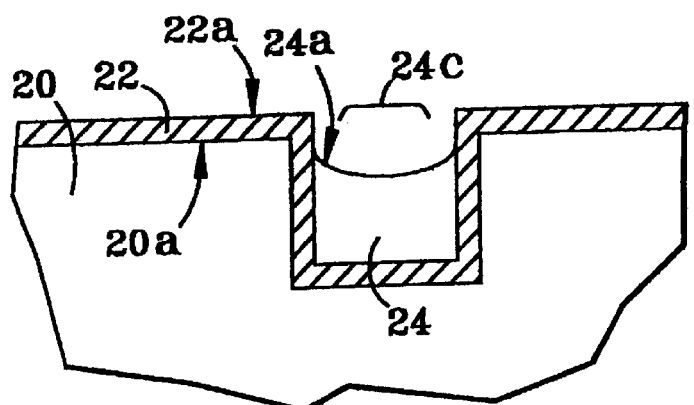

The excess metal (that is, any metal above the level of the top surface 22a of liner 22) is then removed by chemical-mechanical polishing (CMP). The CMP process conditions are chosen to deliberately promote "dishing"—that is, formation of a dish-shaped depression in the material being removed. (Those skilled in the CMP art will recognize that "dishing," which usually is not desired, may be promoted by using a soft polishing pad.) The CMP process thus removes all metal from the top surface 22a, and also removes some metal from the interior of feature 21, so that the top surface 24a of metal 24 is below the top surface 20a of layer 20 (see FIG. 2C). The CMP process thus forms a recess 24c in the topography of the substrate layer 20 and the plated metal 24.

Figure 2D:
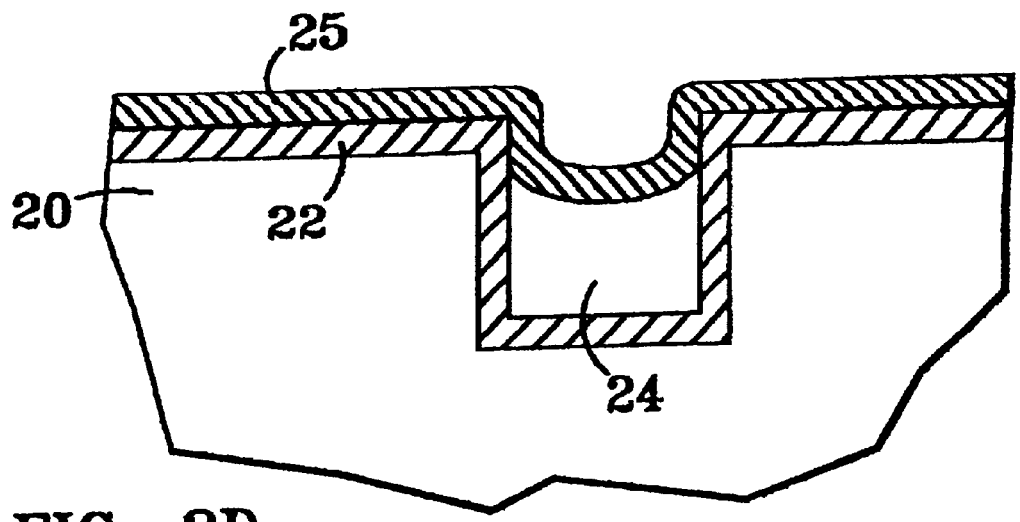

A layer 25 is then deposited on the entire surface, as shown in FIG. 2D. This layer may be of the same material as the liner/barrier layer 22. Another diffusion barrier material such as silicon nitride may be used, instead of or in addition to the liner material. Layer 25 fills in the recess 24c at the top of plated metal 24, so that all surfaces of the plated metal are protected by a diffusion barrier.

Figure 1E:
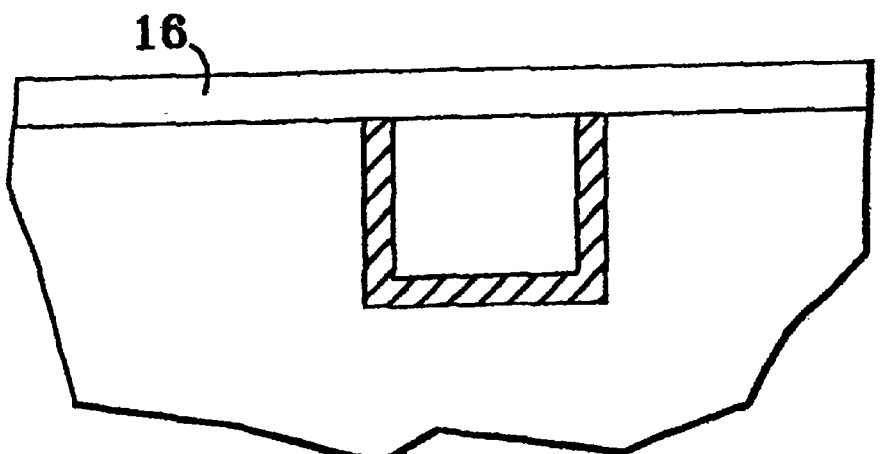
Figure 2E:
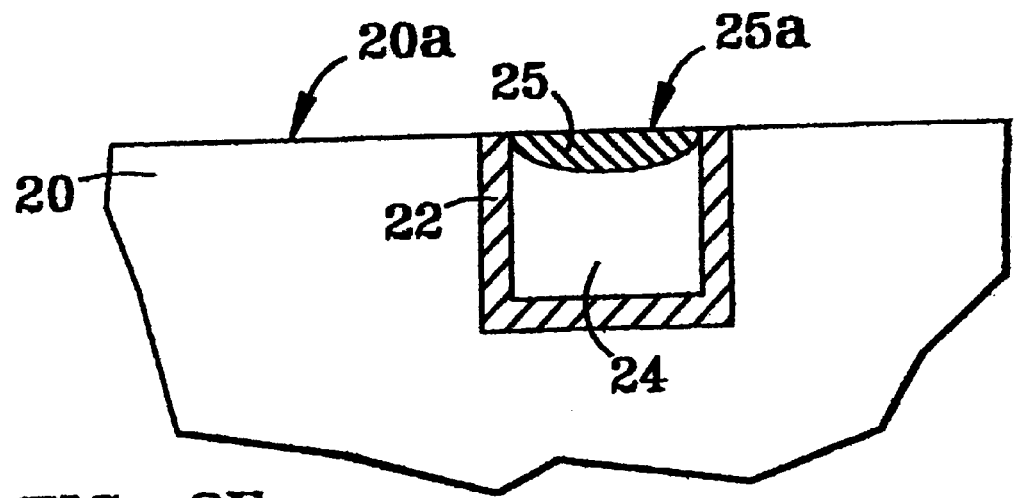

The combination of layers 22, 25 is then planarized to expose the top surface 20a of layer 20 (see FIG. 2E). This planarization process is preferably CMP. In contrast to the process described just above (CMP with "dishing"), the process conditions are chosen to obtain a high degree of planarization so that the top surface 25a of the polished layer 25 is planar with the top surface 20a. Accordingly, as shown in FIG. 2E, a structure of encapsulated metal (plated metal 24 surrounded by liner/barrier layers 22, 25) is formed which is embedded in the substrate layer 20 and has a top surface planar therewith. In contrast to the conventional structure (compare FIGS. 1E and 2E), a high-dielectric-constant barrier layer is confined to the location of the plated metal line.

Second Embodiment: Double Barrier Redeposition

In this embodiment, an encapsulated metal line is obtained using CMP processes with less stringent requirements. Specifically, extra steps are added to the process of the first embodiment to avoid the requirement of a highly planarizing polish of the top surface barrier layers.

Figure 3A:
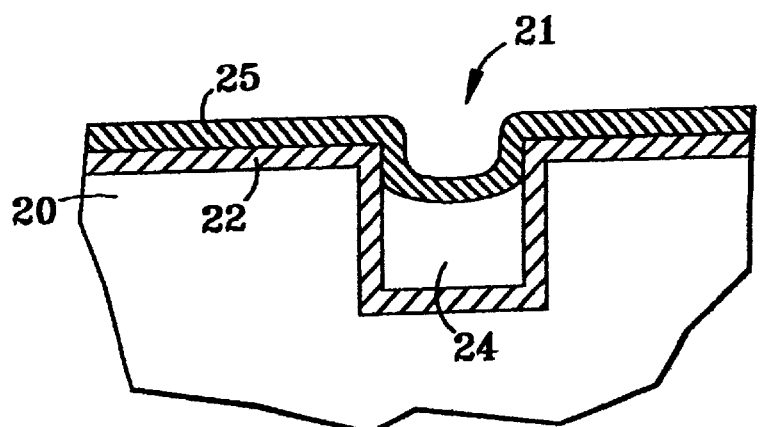
FIGS. 3A–3E illustrate additional steps in a process according to a second embodiment of the present invention.
Figure 3B:
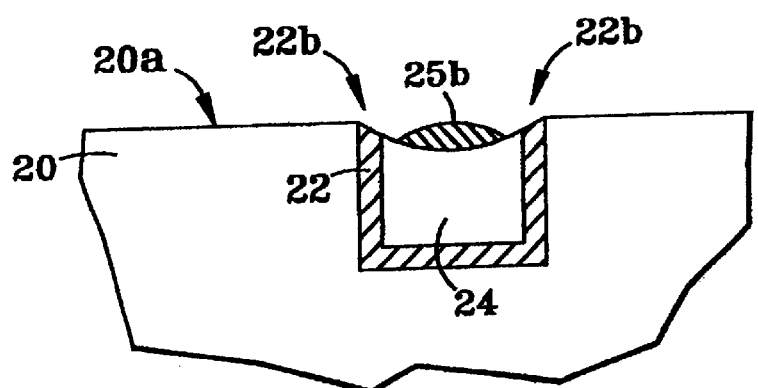

As in the first embodiment, a feature 21 is formed in a substrate layer 20, a liner/barrier layer 22 and a metal seed layer are deposited on the surface, and electroplating is performed so that metal 24 fills feature 21. The plated metal is then polished with a process that promotes "dishing," and a barrier layer 25 is deposited on top of layer 22 and the recessed metal line. The resulting structure is shown in FIG. 3A (comparable to FIG. 2D). Layers 22 and 25 are then planarized, again preferably by CMP. Planarization in this process is assumed to be less perfect than in the first embodiment; for example, overpolishing of the layers may be necessary to compensate for non-uniformities in the polishing rate. The resulting structure is shown in FIG. 3B. After this planarization process, layers 22, 25 are completely removed from the top surface 20a of layer 20; layer 22 is eroded in regions 22b at the corners of plated metal 24; and layer 25 is reduced to a portion 25b in the "dished" recess of the plated metal 24. Compared to the first embodiment, a relaxation of CMP process requirements leads to incomplete encapsulation of the metal line.

Figure 3C:
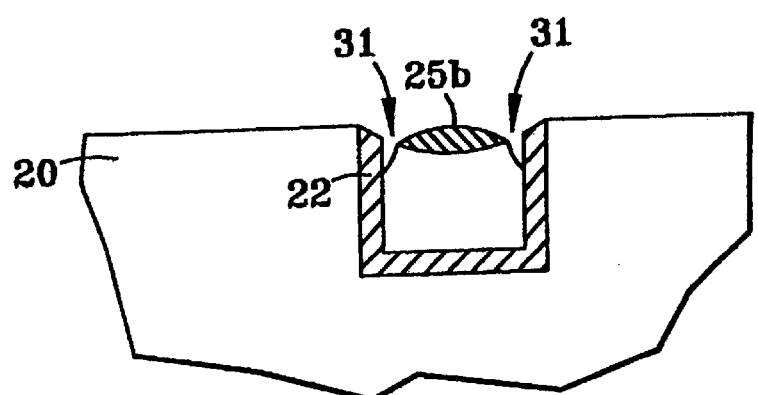
Figure 3D:
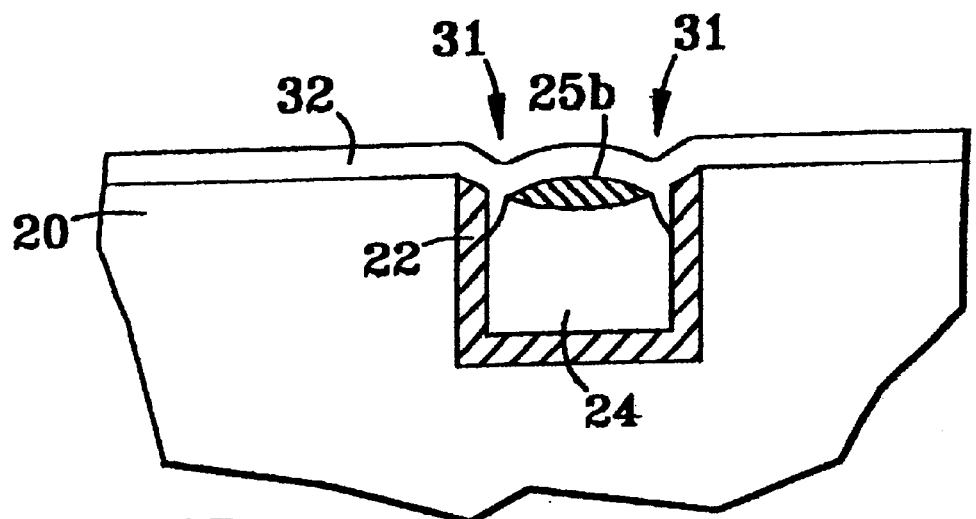

The structure is polished again, this time under conditions chosen to promote "dishing" in the plated metal 24. Since the central area of the metal surface is covered by barrier layer portion 25b, the polishing process forms areas of "microdishing" 31 at the edges of the metal line (see FIG. 3C). This is done to create recessed areas of metal that can be filled and polished to yield an encapsulated structure. Another liner/barrier layer 32 is then deposited on the surface, covering barrier layer portion 25b and filling the "microdishing" areas 31 (FIG. 3D).

Figure 3E:
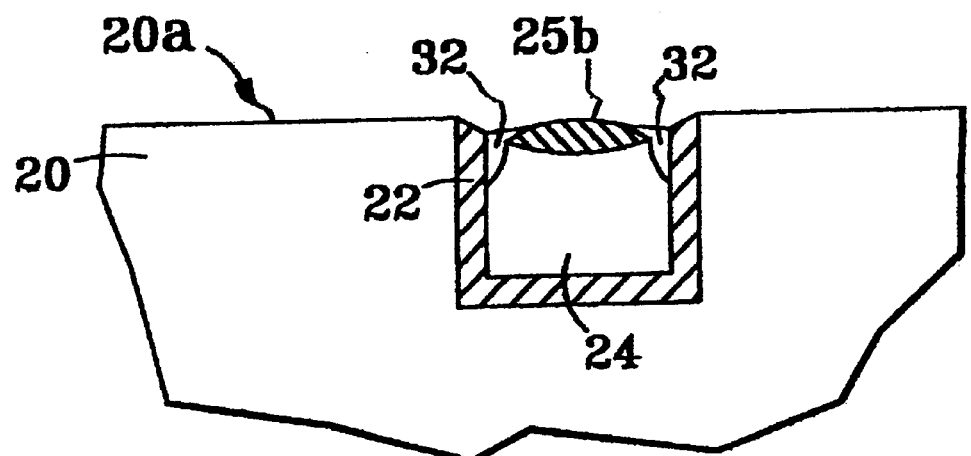

Finally, layer 32 is planarized (again preferably by CMP) so that the top surface 20a of layer 20 is again exposed. It should be noted that the originally recessed area of the plated metal line is covered by barrier layer portion 25b, and the "microdishing" areas 31 are recessed further still. Accordingly, layer 32 may be overpolished (to ensure complete removal from top surface 20a) while still covering the exposed areas of the plated metal. As shown in FIG. 3E, the resulting structure has remaining portions of layer 32 covering the "microdishing" regions 31 of the plated metal 24. As in the first embodiment, a high-dielectric-constant barrier layer on the top surface of the metal (the remaining portions of layers 25 and 32) is confined to the location of the plated metal line.

An encapsulated metal structure is thus obtained, similar to the structure of the first embodiment (compare FIGS. 2E and 3E). The second embodiment has the advantage of less stringent CMP planarization process requirements, at the cost of an additional barrier deposition step.

Application to MIM Capacitors

Figure 4A:
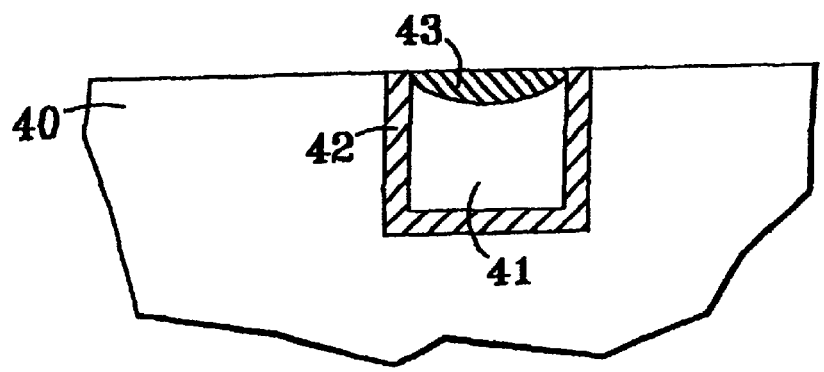
FIGS. 4A–4E illustrate steps in the fabrication of a MIM capacitor using an encapsulated metal structure in accordance with the present invention.

The metal encapsulation process of the present invention may be advantageously used in fabricating MIM capacitors. FIGS. 4A–4E illustrate this fabrication process. FIG. 4A shows an encapsulated metal structure, prepared as in the first embodiment described above. In this example, it will be assumed that the substrate layer 40 is $SiO_2$, the encapsulated metal 41 is Cu, and the barrier layers 42, 43 are a combination of Ta and TaN.

Figure 4B:
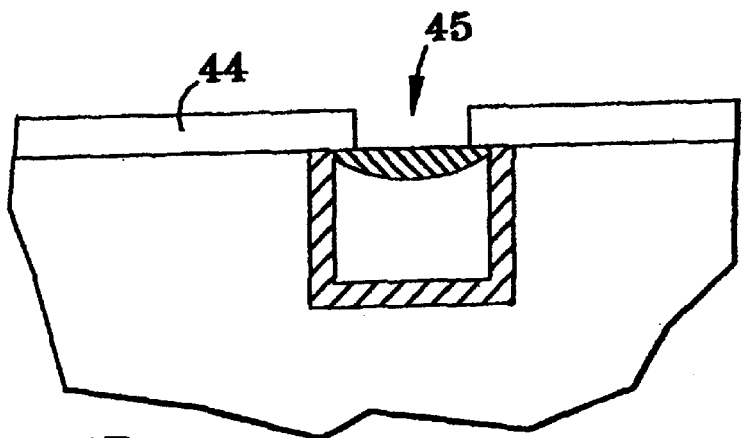

An insulating layer 44 (e.g. $SiO_2$) is deposited on the top surface of the structure of FIG. 4A. This layer is then patterned using standard photolithography techniques and etched to form an opening 45 above the metal structure (FIG. 4B). The opening 45 defines the location of the upper plate of the MIM capacitor.

Figure 4C:
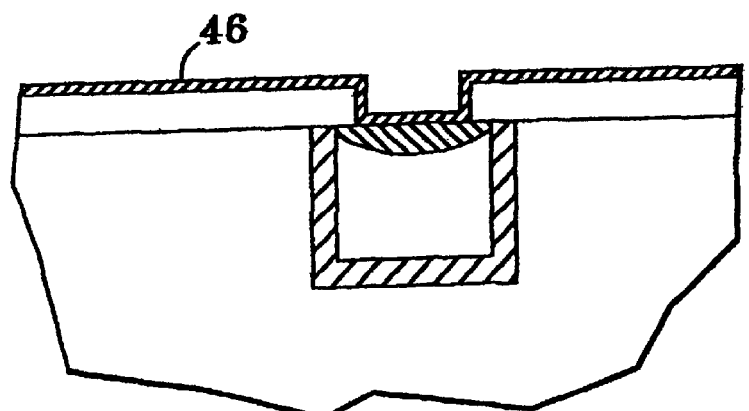
Figure 4D:
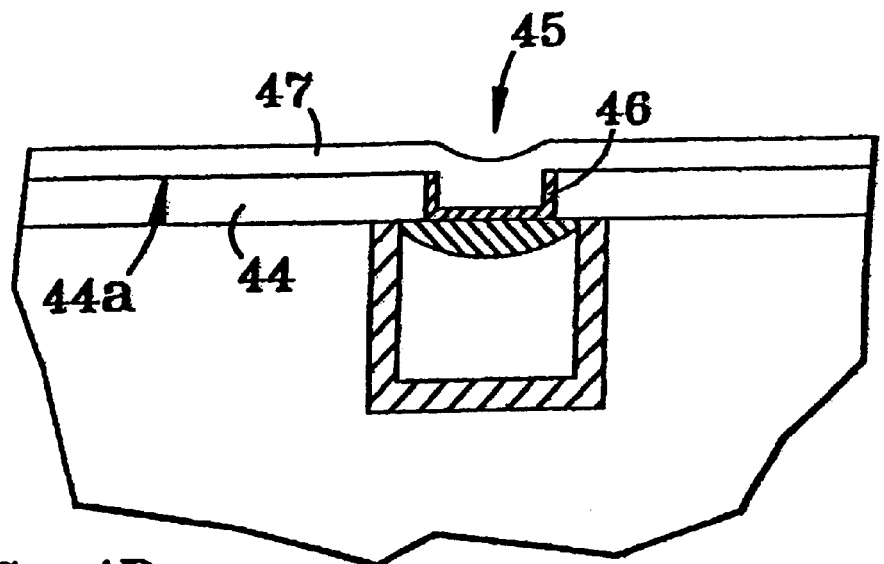

A dielectric layer 46, such as $Ta_2O_5$, is then deposited over layer 44 and in the opening 45, as shown in FIG. 4C. This layer then planarized (preferably by CMP) so that it is removed from the top surface 44a of layer 44, but with a portion remaining inside opening 45. An additional layer 47 is then deposited on layers 44 and 46; this layer (e.g. TaN) forms the upper capacitor plate in the MIM capacitor structure (see FIG. 4D). Layer 47 is then planarized so that the top surface 44a of layer 44 is again exposed. The remaining portion of layer 47 is thus confined to the opening 45, above the encapsulated metal 41 with the dielectric layer 46 therebetween. Alternatively, layer 47 could be deposited immediately after layer 46, and the two layers then planarized in a single polishing process.

Figure 4E:
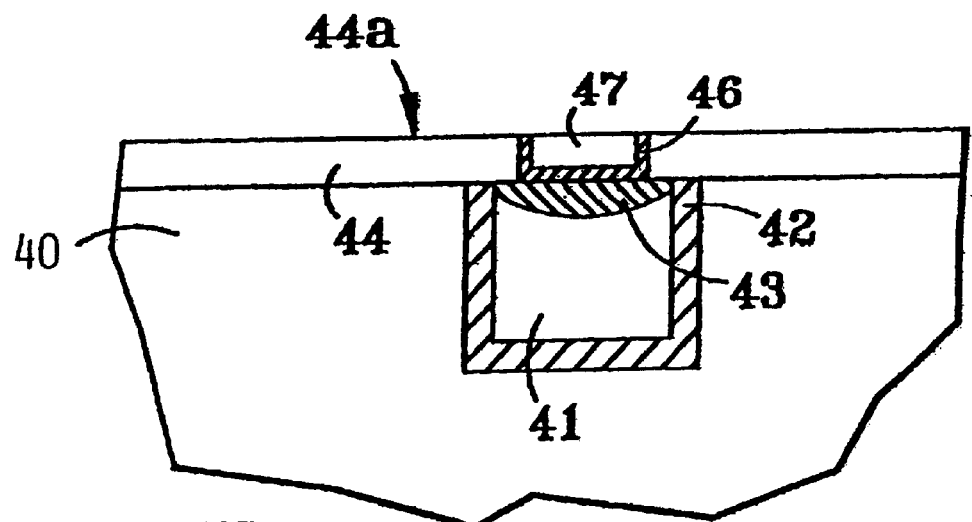

The completed MIM capacitor structure is shown in FIG. 4E. It should be noted that only one lithographic process is required in this MIM capacitor fabrication procedure. Furthermore, control of the size of opening 45 permits control of the plate area of the MIM capacitor.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A metal-insulator-metal (MIM) capacitor structure, comprising:

a first substrate layer with a feature formed therein, the first substrate layer having a top surface, the feature having sidewalls and a bottom;

an encapsulated metal structure in the feature, where the sidewalls and bottom of the feature are covered by a first barrier layer and the feature is filled with metal covered by an additional barrier layer in contact with the first barrier layer, to form a lower plate of the capacitor structure;

a second substrate layer on the top surface of the first substrate layer, the second substrate layer having an opening formed therein overlying the encapsulated metal structure;

a dielectric layer covering sidewalls of the opening and a portion of the encapsulated metal structure at a bottom of the opening; and an additional layer covering the dielectric layer on the sidewalls and on the bottom of the opening and filling the opening, to form an upper plate of the capacitor structure, wherein the dielectric layer and the additional layer are planarized so that the top surface of the second substrate layer is exposed.

2. A MIM capacitor structure according to claim 1, wherein the metal comprises copper.

3. A MIM capacitor structure according to claim 1, wherein the first barrier layer comprises tantalum and tantalum nitride.

4. A MIM capacitor structure according to claim 1, wherein the dielectric layer comprises $Ta_2O_5$.

5. A MIM capacitor structure according to claim 1, wherein the additional layer comprises tantalum nitride.

* * * * *